(12) United States Patent
Zhang et al.

(10) Patent No.: US 11,469,285 B2
(45) Date of Patent: Oct. 11, 2022

(54) DISPLAY SUBSTRATE HAVING BRIDGE CONNECTED ISLAND PORTIONS AND DISPLAY DEVICE

(71) Applicant: BOE TECHNOLOGY GROUP CO., LTD., Beijing (CN)

(72) Inventors: Haohan Zhang, Beijing (CN); Yansong Li, Beijing (CN); Pinfan Wang, Beijing (CN); Shanshan Bai, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 16/869,866

(22) Filed: May 8, 2020

(65) Prior Publication Data
US 2021/0104579 A1    Apr. 8, 2021

(30) Foreign Application Priority Data
Oct. 8, 2019  (CN) .......................... 201910950175.1

(51) Int. Cl.
*H01L 27/32* (2006.01)
*H01L 51/00* (2006.01)
(Continued)

(52) U.S. Cl.
CPC ........ *H01L 27/326* (2013.01); *H01L 27/3209* (2013.01); *H01L 51/0097* (2013.01);
(Continued)

(58) Field of Classification Search
CPC ............... H01L 27/326; H01L 27/3209; H01L 27/3211; H01L 27/3244; H01L 51/0097;
(Continued)

(56) References Cited

U.S. PATENT DOCUMENTS 9,391,286 B1 *  7/2016  Kwon ................. H01L 51/5275
9,536,860 B2 *  1/2017  Yoon .................. H01L 51/0097
(Continued)

FOREIGN PATENT DOCUMENTS

CN    109087931 A    12/2018
CN    109308851 A    2/2019
(Continued)

OTHER PUBLICATIONS

Office Action dated Aug. 18, 2021 issued in corresponding Chinese Application No. 201910950175.1.

*Primary Examiner* — Ida M Soward
(74) *Attorney, Agent, or Firm* — Nath, Goldberg & Meyer; Joshua B. Goldberg

(57) ABSTRACT

A display substrate includes a substrate, including a plurality of island portions spaced apart from each other and a plurality of bridge portions connected between the island portions, the substrate having a plurality of openings in regions without the plurality of island portions and the plurality of bridge portions; a layer structure on each of the plurality of island portions and including a light-emitting layer, a common auxiliary layer and a first electrode layer stacked with each other, the layer structure on each of the plurality of island portions forms at least one light-emitting unit. On each of the plurality of island portions, an orthographic projection of the common auxiliary layer on the island portion covers an orthographic projection of the light-emitting layer on the island portion.

20 Claims, 4 Drawing Sheets

(51) Int. Cl.
  *H01L 51/50* (2006.01)
  *H01L 51/52* (2006.01)
  *H01L 51/56* (2006.01)

(52) U.S. Cl.
  CPC .......... *H01L 51/5253* (2013.01); *H01L 51/56* (2013.01); *H01L 27/3211* (2013.01); *H01L 27/3244* (2013.01); *H01L 51/5212* (2013.01); *H01L 2251/301* (2013.01); *H01L 2251/53* (2013.01); *H01L 2251/5338* (2013.01)

(58) Field of Classification Search
  CPC ............. H01L 51/5253; H01L 51/5212; H01L 2251/301; H01L 2251/5338; H01L 2251/53; H01L 27/3246; H01L 27/3288; H01L 51/5048; H01L 51/5088; H01L 51/5228; H01L 51/5237
  See application file for complete search history.

(56) References Cited

U.S. PATENT DOCUMENTS

| | | | | |
|---|---|---|---|---|
| 9,841,548 | B2 * | 12/2017 | Kim | G06F 1/1652 |
| 10,056,435 | B2 * | 8/2018 | Hong | H01L 51/0097 |
| 10,186,648 | B2 * | 1/2019 | Kim | H01L 33/06 |
| 10,224,495 | B2 * | 3/2019 | Sasaki | H01L 27/3276 |
| 10,461,142 | B2 * | 10/2019 | Hong | H01L 27/3276 |
| 10,466,746 | B2 * | 11/2019 | Hong | G06F 1/1626 |
| 10,504,936 | B2 * | 12/2019 | Park | H01L 27/1244 |
| 10,644,079 | B2 * | 5/2020 | Hong | H01L 27/326 |
| 10,649,496 | B2 * | 5/2020 | Choi | G06F 1/1652 |
| 10,651,265 | B2 * | 5/2020 | Park | H01L 51/5256 |
| 10,684,716 | B2 * | 6/2020 | Zhai | H01L 27/323 |
| 10,700,158 | B2 * | 6/2020 | Park | H01L 27/3244 |
| 10,748,982 | B2 * | 8/2020 | Hong | H01L 27/3258 |
| 10,930,709 | B2 * | 2/2021 | Lamkin | H01L 51/5234 |
| 10,964,769 | B2 * | 3/2021 | Park | H01L 27/3276 |
| 11,011,599 | B2 * | 5/2021 | Kim | H01L 27/3276 |
| 11,038,130 | B2 * | 6/2021 | Liu | H01L 27/3276 |
| 11,056,472 | B2 * | 7/2021 | Kim | H01L 33/62 |
| 11,069,268 | B2 * | 7/2021 | Niu | G09G 3/006 |
| 11,164,917 | B1 * | 11/2021 | Wang | G02F 1/133331 |
| 2009/0283891 | A1 * | 11/2009 | Dekker | H05K 1/0283 257/E23.177 |
| 2010/0002402 | A1 * | 1/2010 | Rogers | H05K 1/028 361/749 |
| 2010/0193794 | A1 | 8/2010 | Kim et al. | |
| 2014/0299362 | A1 * | 10/2014 | Park | H05K 1/0283 174/254 |
| 2016/0049602 | A1 * | 2/2016 | Kim | H01L 51/0097 257/40 |
| 2017/0086291 | A1 * | 3/2017 | Cotton | H01L 23/5385 |
| 2018/0217361 | A1 * | 8/2018 | Yoshioka | H04N 5/2257 |
| 2019/0250450 | A1 * | 8/2019 | Li | G02F 1/13471 |
| 2019/0341433 | A1 * | 11/2019 | Im | H01L 27/3276 |
| 2019/0378873 | A1 * | 12/2019 | Lee | H01L 33/505 |
| 2020/0026332 | A1 * | 1/2020 | Hong | B32B 3/263 |
| 2020/0051964 | A1 * | 2/2020 | Jung | H01L 25/162 |
| 2020/0137472 | A1 * | 4/2020 | Won | H04R 7/045 |
| 2021/0026411 | A1 * | 1/2021 | Ke | G06F 1/1652 |
| 2021/0083211 | A1 * | 3/2021 | Park | H01L 27/3272 |

FOREIGN PATENT DOCUMENTS

| | | |
|---|---|---|
| CN | 109887982 A | 6/2019 |
| CN | 109935730 A | 6/2019 |
| CN | 110112150 A | 8/2019 |
| JP | 2013118182 A | 6/2013 |

\* cited by examiner

DISPLAY SUBSTRATE HAVING BRIDGE CONNECTED ISLAND PORTIONS AND DISPLAY DEVICE

CROSS REFERENCE TO RELATED APPLICATION

This application claims priority to Chinese patent application No. 201910950175.1, filed on Oct. 8, 2019, the entire contents of which are incorporated herein by reference.

TECHNICAL FIELD

The present disclosure relates to the field of display technology, and particularly relates to a display substrate, a fabricating method thereof and a display device.

BACKGROUND

The stretchable display substrate has a good prospect for development in future due to its characteristics such as stretchability, foldability and the like.

SUMMARY

In one aspect, the present disclosure provides a display substrate including:

a substrate including a plurality of island portions spaced apart from each other and a plurality of bridge portions connected between the island portions, the substrate having a plurality of openings in regions without the island portions and the bridge portions;

a layer structure on each of the plurality of island portions and comprising a light-emitting layer, a common auxiliary layer and a first electrode layer stacked with each other, the layer structure on each of the plurality of island portions forms at least one light-emitting unit, and an encapsulation layer on a side of the light-emitting unit away from the substrate;

wherein on each of the plurality of island portions, an orthographic projection of the common auxiliary layer on the island portion covers an orthographic projection of the light-emitting layer on the island portion, an orthographic projection of the first electrode layer on the island portion covers the orthographic projection of the common auxiliary layer on the island portion, the orthographic projection of the first electrode layer on the island portion is inside the island portion, and an orthographic projection of the encapsulation layer on the island portion covers the island portion.

In an embodiment, on each of the plurality of island portions, the layer structure forms a plurality of light-emitting units, the layer structure of each of the plurality of light-emitting units further includes a second electrode layer, the light-emitting layer is between the first electrode layer and the second electrode layer, and the second electrode layer is on a side of the first electrode layer close to the substrate; and the island portion has a pixel region comprising a plurality of sub-pixel regions, an orthographic projection of each second electrode layer on the island portion defines one sub-pixel region, the pixel region is inside the island portion, and orthographic projections of the second electrode layer and the light-emitting layer of each of the plurality of light-emitting units on the island portion are inside one sub-pixel region.

In an embodiment, the first electrode layer on each of the plurality of island portions is formed as a single piece.

In an embodiment, on each of the plurality of island portions, the pixel region is inside the orthographic projection of the first electrode layer on the island portion.

In an embodiment, the common auxiliary layer is between the first electrode layer and the second electrode layer.

In an embodiment, on each of the plurality of island portions, the pixel region is inside the orthographic projection of the common auxiliary layer on the island portion.

In an embodiment, the layer structure on each of the plurality of island portions includes a plurality of common auxiliary layers, and orthographic projections of the plurality of common auxiliary layers in different layers on the island portion coincide with each other.

In an embodiment, on each of the plurality of island portions, the first electrode layer is formed as a single piece;

the orthographic projection of the common auxiliary layer on the island portion falls inside the orthographic projection of the first electrode layer on the island portion;

the island portion is further provided with an electrode lead connected to the first electrode layer, a through hole is in a layer structure between the first electrode layer and the electrode lead, and the first electrode layer is in contact with the electrode lead through the through hole; and an orthographic projection of the through hole on the island portion is outside the orthographic projection of the common auxiliary layer on the island portion and inside the orthographic projection of the first electrode layer on the island portion.

In an embodiment, the first electrode layer is a cathode layer and the second electrode layer is an anode layer.

In an embodiment, the substrate is made of a flexible material, the plurality of island portions are arranged in an array, and the plurality of bridge portions are configured to deform in response to the display substrate being stretched so that the display substrate is stretchable.

In an embodiment, when viewed in a plan view, the electrode lead is around a periphery of the common auxiliary layer and extends in a region between the periphery of the common auxiliary layer and a periphery of the first electrode layer and to the bridge portion.

In an embodiment, the first electrode layer on each island portion is electrically connected to the electrode lead.

In an embodiment, the layer structure further includes a pixel defining layer configured to define the light-emitting units, the through hole being in the pixel defining layer.

In an embodiment, four through holes are in the layer structure between the first electrode layer and the electrode lead, and orthographic projections of the four through holes on the island portion are at four corners of the orthographic projection of the first electrode layer on the island portion.

In an embodiment, the encapsulation layer includes a first encapsulation sub-layer, a second encapsulation sub-layer, a third encapsulation sub-layer, and the first encapsulation sub-layer and the third encapsulation sub-layer include an inorganic material and the second encapsulation sub-layer includes an organic material.

In an embodiment, the first encapsulation sub-layer and the third encapsulation sub-layer are whole-layer structures, respectively, orthographic projections of the first encapsulation sub-layer and the third encapsulation sub-layer on the plurality of island portions cover the plurality of island portions, and on each of the plurality of island portions, an orthographic projection of the second encapsulation sub-layer on the island portion is completely overlapped with the orthographic projection of the first electrode layer on the island portion.

In another aspect, the present disclosure provides a display device, wherein the display device includes the display substrate according to the embodiments of the present disclosure.

In further another aspect, the present disclosure provides a method for fabricating a display substrate, including:

providing a substrate, the substrate comprising a plurality of island portions spaced apart from each other and a plurality of bridge portions connected between the island portions, the substrate having a plurality of openings in regions without the plurality of island portions and the plurality of bridge portions;

forming, on each of the plurality of island portions, a layer structure comprising a light-emitting layer, a common auxiliary layer, and a first electrode layer stacked with each other, such that the layer structure on each of the plurality of island portions form at least one light-emitting unit; and forming an encapsulation layer on a side of the light-emitting unit away from the substrate;

wherein on each of the plurality of island portions, an orthographic projection of the common auxiliary layer on the island portion covers an orthographic projection of the light-emitting layer on the island portion, an orthographic projection of the first electrode layer on the island portion covers the orthographic projection of the common auxiliary layer on the island portion, the orthographic projection of the first electrode layer on the island portion is inside the island portion, and an orthographic projection of the encapsulation layer on the island portion covers the island portion.

In an embodiment, forming the layer structure on each of the plurality of island portions includes:

forming a plurality of second electrode layers on each of the plurality of island portions by a patterning process, wherein an orthographic projection of each of the plurality of second electrode layers on the island portion defines a sub-pixel region;

forming a plurality of light-emitting layers in one-to-one correspondence to the plurality of second electrode layers on each of the plurality of island portions by a patterning process, wherein an orthographic projection of each of the plurality of light-emitting layer on the island portion is inside one sub-pixel region; and forming the first electrode layer on each of the plurality of island portions by a patterning process by corresponding each of first openings of a first mask to a region of the island portion where a respective one of the first electrode layers is to be formed, the orthographic projection of the first electrode layer on the island portion covering all sub-pixel regions of the island portion, and the sub-pixel regions being inside the orthographic projection of the first electrode layer on the island portion.

In an embodiment, after forming the second electrode layer and before forming the first electrode layer, the method further comprises:

forming at least one common auxiliary layer on each of the plurality of island portions by a patterning process by corresponding each of second openings of a second mask to a region of the island portion where a respective one common auxiliary layer is to be formed, the orthographic projection of the common auxiliary layer on the island portion covering all sub-pixel regions on the island portion, and the sub-pixel regions being inside the orthographic projection of the common auxiliary layer on the island portion.

DETAILED DESCRIPTION

Figure 1:
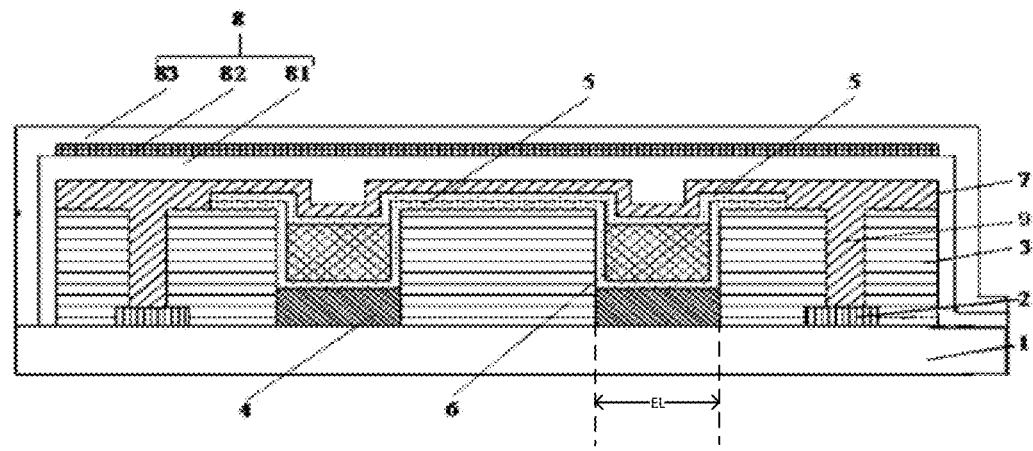
FIG. 1 is a schematic cross-sectional view of a display substrate according to an embodiment of the present disclosure (some structures are not shown)

In order to make those skilled in the art better understand the technical solutions of the present disclosure, the present disclosure will be described in further detail below with reference to the accompanying drawings and the detailed description.

In the present application, unless otherwise specified, the following technical terms should be understood according to the following explanations.

A plurality of layer structures on each island portion are stacked with each other, and the expression "the plurality of layer structures are stacked" means that a plurality of film layers are sequentially formed in a certain order, but does not mean to have a spatial stacking relationship at all positions, or contact with each other.

The term "patterning process" refers to a step of forming a structure having a specific pattern, which may be a photolithography process including one or more of forming a material layer, coating a photoresist, exposing, developing, etching, stripping the photoresist, and the like; of course, the "patterning process" may also be an imprinting process, an inkjet printing process, or other processes.

In order to have the stretchable and foldable characteristics, the substrate of the display substrate has an island-bridge structure, that is, the substrate of the display substrate includes a plurality of island portions spaced apart from each other and bridge portions, and the substrate is provided with a plurality of openings in the regions without the island portions and the bridge portions. The light-emitting units are formed on the plurality of island portions, the plurality of island portions are connected through the bridge portions, and the openings are between the island portions and the bridge portions, such that the display substrate is stretched mainly through deformation of the bridge portions, and deformation of the island portions and the light-emitting units on the island portions is small, and therefore damage to the light-emitting units is avoided.

However, in the conventional stretchable display substrate, some layer structures (for example, a cathode layer, an electron transport layer, a hole transport layer, etc.) of the light-emitting units on the substrate are formed on the substrate by evaporation, and the entire surface of the island portions and the bridge portions are covered with the layer structures of the light-emitting units, making it difficult to encapsulate all the layer structures of the light-emitting units with the encapsulation layer. As a result, moisture in the air easily enters into the light-emitting units through the layer structures at the openings, thereby causing failure of the light-emitting units.

Herein, the expression "element A covers element B (or the orthographic projection of element A on a reference plane covers the orthographic projection of element B on the reference plane)" may mean that the orthographic projection region of element B on the reference plane is within the orthographic projection region of element A on the reference plane, or the orthographic projection region of element B on the reference plane completely overlaps (i.e., coincides with) the orthographic projection region of element A on the reference plane.

Herein, the expression "region C is inside region D" may mean that the periphery of region D encloses the periphery of region C, and the periphery of region C does not coincide with the periphery of region D.

Figure 2A:
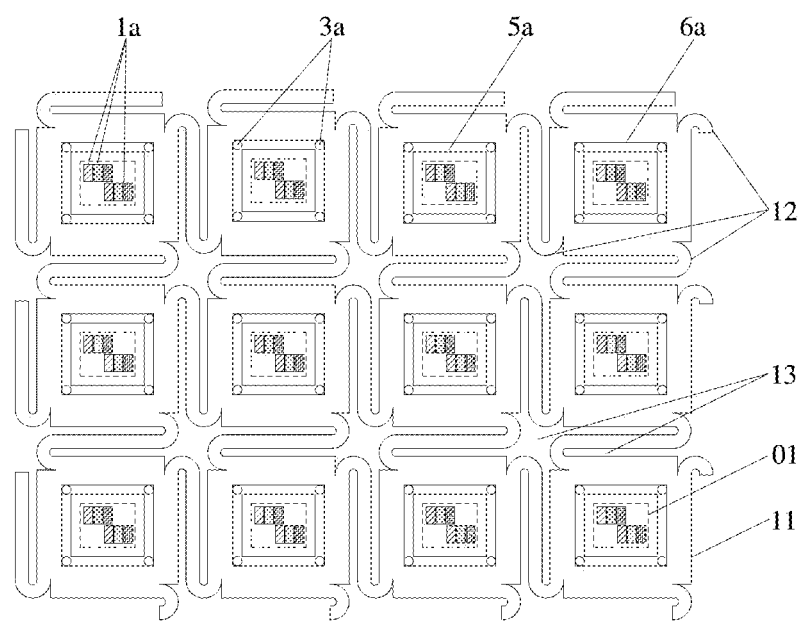
FIGS. 2a and 2b are partial plan views of a display substrate according to an embodiment of the present disclosure (some structures are not shown)
Figure 2B:
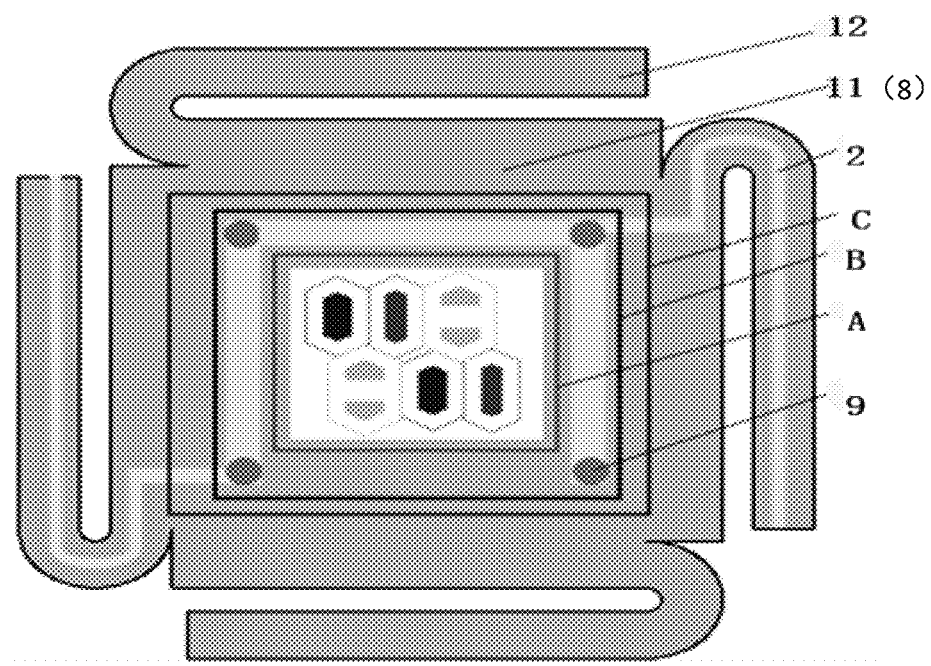

Referring to FIGS. 1, 2a and 2b, the present embodiment provides a display substrate, which includes a substrate 1, the substrate 1 includes a plurality of island portions 11 spaced apart with each other and a plurality of bridge portions 12 each connected between different island portions 11, and the substrate 1 has a plurality of openings 13 in a region without the island portions and the bridge portions. Each island portion 11 is provided with a plurality of layer structures thereon, the layer structures on each island portion 11 form at least one light-emitting unit EL, and a side of the light-emitting unit EL away from the substrate 1 is provided with an encapsulation layer 8.

In an embodiment, the bridge portion 12 is configured to deform when the display substrate is stretched, so that the display substrate has stretchability. An electrode lead 2 for connecting cathodes in adjacent island portions 11 to each other are also provided in the bridge portion 12, so that a common cathode voltage VSS is supplied to the light-emitting units on the island portions of the display substrate through the electrode lead.

There is an interval between an periphery of the orthographic projection of any layer structure on an island portion 11 and an periphery of the island portion 11, and the orthographic projection of the encapsulation layer 8 on an island portion 11 covers the island portion 11.

For example, the orthographic projection of the layer structure on an island portion 11 is inside the island portion, and an area of the orthographic projection is smaller than an area of the island portion 11.

In an embodiment, the light-emitting unit is a light source of the display substrate for displaying an image, and the light-emitting unit may be an organic light-emitting diode (OLED) device. The layer structures on each island portion 11 may include a first electrode layer (anode layer) 4, a light-emitting layer 6, a second electrode layer (cathode layer) 7, and the like.

In this embodiment, the orthographic projection of any layer structure (a structure for display other than the encapsulation layer 8) on an island portion 11 falls inside the island portion 11, and the orthographic projection of the encapsulation layer 8 on an island portion 11 covers the island portion 11. That is, when viewed in a plan view, any layer structure on an island portion 11 is smaller than the island portion 11, and the encapsulation layer 8 on an island portion 11 is larger than the island portion 11.

Therefore, after the encapsulation layer 8 is disposed on the island portion 11, a partial region of the island portion 11 not covered by the orthographic projections of the plurality of layer structures can be in direct contact with the encapsulation layer 8, so that all the layer structures on the island portion 11 are encapsulated in an independent encapsulation structure composed of the island portion 11 and the encapsulation layer 8, thereby avoiding the failure of the light-emitting unit due to the fact that the layer structure of the light-emitting unit is outside the encapsulation layer 8 and moisture in the air enters into the light-emitting unit through the layer structure.

In an embodiment, the layer structures on each island portion 11 form a plurality of light-emitting units, and the layer structures of each light-emitting unit include a first electrode layer 4, a light-emitting layer 6, and a second electrode layer 7. The light-emitting layer 6 is disposed between the first electrode layer 4 and the second electrode layer 7, and the first electrode layer 4 is on a side of the second electrode layer 7 close to the substrate 1. In an embodiment, the light-emitting layer 6 is formed by evaporation of a light-emitting material using a fine metal mask (FMM).

The island portion 11 has a pixel region 01, the pixel region 01 is inside the island portion 11, the pixel region 01 includes a plurality of sub-pixel regions, and orthographic projections of the first electrode layer 4 and the light-emitting layer 6 of each light-emitting unit on the island portion 11 are inside one sub-pixel region.

In general, the smallest unit representing a graphic in display is referred to as a dot, and the dot as the smallest unit in the display substrate is referred to as a pixel. One light-emitting unit may correspond to one sub-pixel. Each pixel region 01 may include a plurality of pixels. In color display, each pixel may include three color sub-pixels, for example, a red sub-pixel, a green sub-pixel, and a blue sub-pixel, or may include four color sub-pixels, for example, a red sub-pixel, a green sub-pixel, a blue sub-pixel, and a yellow sub-pixel.

Taking the OLED display substrate as an example, a plurality of light-emitting units are arranged on the substrate 1 in an array, and each sub-pixel (sub-pixel region) has a light-emitting unit of a corresponding color.

As shown in FIGS. 2a and 2b, the orthographic projections of the first electrode layer 4 and the light-emitting layer 6 of each light-emitting unit on the island portion 11 (or substrate 1) (in the figure, 1a refers to the periphery of the orthographic projection of the light-emitting layer on the island portion) defines one sub-pixel region, i.e., the light-emitting layer 6 in each sub-pixel region has the corresponding color. It can be seen that the first electrode layer 4 and the light-emitting layer 6 of each light-emitting unit are opposite to each other, and the plurality of separate first electrode layers 4 and the plurality of separate light-emitting layers 6 are provided on each island portion 11, so that each of the plurality of light-emitting units can emit light independently regardless of whether the second electrode layers 7 of the plurality of light-emitting units are separate structures or form a single structure.

All the sub-pixel regions on each island portion 11 are in the pixel region 01. The pixel region 01 (i.e., the region enclosed by each dotted line in FIG. 2a) on each island portion 11 is a predetermined region. The pixel region 01 is inside the island portion 11, i.e., the pixel region 01 is smaller than the island portion 11 when viewed in a plan view.

In the above embodiments, the first electrode layer 4 may be an anode, and the second electrode layer 7 may be a cathode. Alternatively, the first electrode layer 4 may be a cathode and the second electrode layer 7 may be an anode.

In an embodiment, all the second electrode layers 7 on each island portion 11 are connected to form a single piece.

In the above embodiment, all the second electrode layers 7 on each island portion 11 are connected to form a single piece, so that one electrode connection line (or electrode lead 2) can supply power to the second electrode layers 7 of all the light-emitting units on the island portion 11, and the voltage drop (IR drop) for the light-emitting units on each island portion 11 is reduced.

Meanwhile, the second electrode layers 7 are generally fabricated by a patterning process, that is, the second electrode layers 7 on respective island portions 11 are formed on the substrate 1 using a first mask 90 (for example, patterned open mask for evaporation). The first mask 90 has a plurality of first opening 91 for defining the pattern of the second electrode layers 7, and the plurality of first openings 91 in one-to-one correspondence to the plurality of island portions 11 of the substrate 1.

In the patterning process, vapor of materials metal) of the second electrode layers 7 is evaporated onto the first mask 90, and the vapor may pass through the first openings 91 of the first mask 90 and then be deposited on the substrate 1, so as to form the second electrode layers 7 at desired positions. As can be seen, compared with the case that all the second electrode layers 7 on each island portion 11 are separate structures, the number of the first openings 91 of the first mask 90 is reduced, and the size of the first opening 91 is increased, so that it is convenient for fabricating the first mask 90, and therefore the process difficulty in forming the second electrode layer 7 on each island portion 11 is reduced by the technical solution of the present disclosure.

Figure 4:
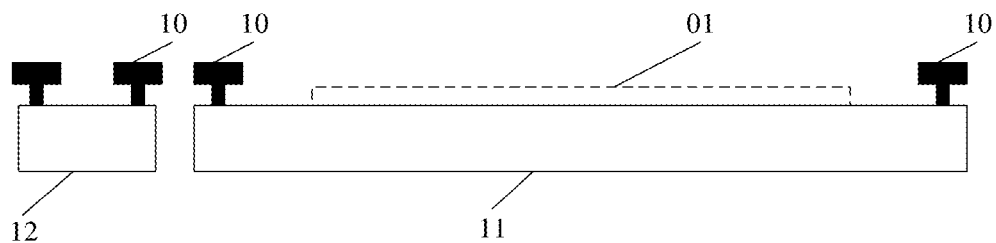
FIG. 4 is a schematic structural diagram of a substrate of a conventional display substrate (some structures are not shown)
Figure 5:
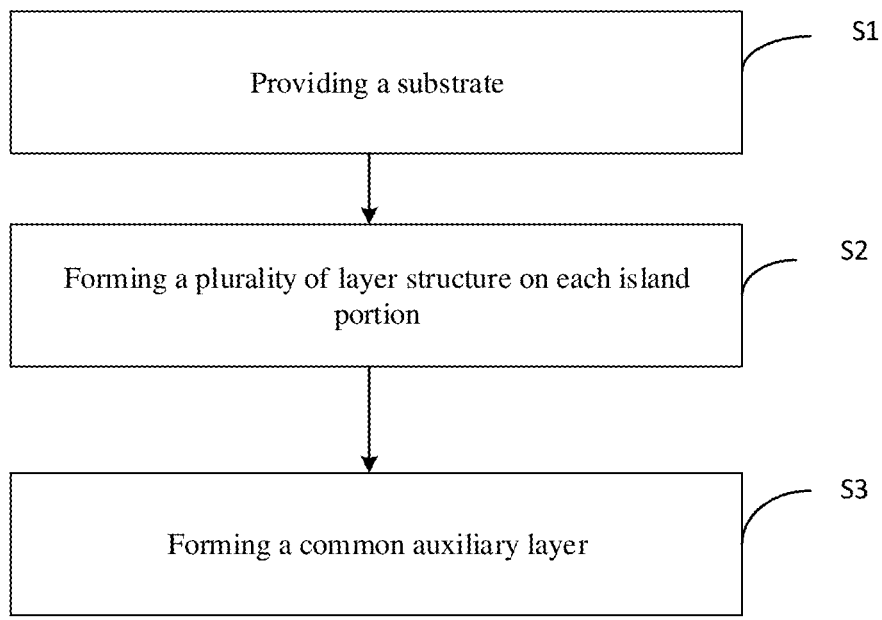
FIG. 5 is a flowchart illustrating a method of fabricating a display substrate according to an embodiment.

Meanwhile, in the related art, as shown in FIG. 4, before the second electrode layers 7 are formed on the substrate 1, isolation pillars 10 are first formed on the substrate 1, and then the second electrode layers 7 are formed on the entire substrate 1 by a deposition process of a material layer, such as evaporation or inkjet printing. In this case, the isolation pillars 10 serve to isolate the second electrode layer 7 on the island portion 11 from the second electrode layer 7 on the bridge portion 12. In principle, the isolation pillars 10 can isolate the second electrode layer 7 on the island portion 11 from the second electrode layer 7 on the bridge portion 12. However, in practice, the effect of isolating the second electrode layers 7 by the isolation pillars 10 is not good, that is, the second electrode layer 7 on the island portion 11 and the second electrode layer 7 on the bridge portion 12 are easily connected to each other. Therefore, moisture in the air inevitably enters into the inside of the light-emitting unit through the portion of the second electrode layer 7 located at the periphery of the island portion 11 or at the opening between the bridge portion 12 and the island portion 11.

Compared with the related art, in the technical solution of the present application, the second electrode layer 7 on each island portion 11 is only disposed on the island portion 11, and the second electrode layer 7 is smaller than the island portion 11, so that it is ensured that second electrode layer 7 can be completely encapsulated by the encapsulation layer 8.

In an embodiment, as shown in FIG. 2a, the orthographic projection 6a of the second electrode layer 7 on the island portion 11 covers the pixel region 01, and the periphery of the orthographic projection 6a of the second electrode layer 7 on the island portion 11 surrounds the outside of the periphery of the pixel region 01.

The periphery of the orthographic projection of the second electrode layer 7 on the island portion 11 surrounds the outside of the periphery of the pixel region 01, i.e., when viewed in a plan view, the second electrode layer 7 is larger than the pixel region 01, i.e., the first opening 91 is larger than the pixel region 01. Therefore, when the second electrode layer 7 is formed by the patterning process, and the first opening 91 of the first mask 90 is slightly shifted, due to the position shift, from the region where the second electrode layer 7 is to be formed (the region covering the pixel region), it can be ensured that the second electrode layer 7 can still cover all the light-emitting layers 6 and all the first electrode layers 4 on each island portion 11.

In an embodiment, the layer structures of each pixel unit further include at least one auxiliary layer, each between the first electrode layer 4 and the second electrode layer 7.

In an embodiment, the auxiliary layer may include a hole injection layer and a hole transport layer disposed between the first electrode layer 4 and the light-emitting layer 6, and an electron transport layer and an electron injection layer disposed between the light-emitting layer 6 and the second electrode layer 7, or the like. The auxiliary layer can improve the light-emitting efficiency of the light-emitting unit and improve the stability of the light-emitting unit.

In an embodiment, the auxiliary layers in the same layer are integrally connected to form a common auxiliary layer 5 on each island portion 11.

In each light-emitting unit, the light-emitting layer 6 may be formed by evaporating a red light-emitting material, a green light-emitting material, or a blue light-emitting material using a fine metal mask.

Herein, the expression "the auxiliary layers in the same layer" refers to auxiliary layers that have the same function. For example, each light-emitting unit may include two auxiliary layers, that is, a hole transport layer disposed between the light-emitting layer 6 and the first electrode layer 4 and an electron transport layer disposed between the light-emitting layer 6 and the second electrode layer 7, and in this case, the hole transport layers of all the light-emitting units on each island portion 11 are connected to form a single piece and all the electron transport layers of all the light-emitting units on each island portion 11 are connected form a single piece. Similarly, the hole injection layers of the light-emitting units on each island portion 11 are connected to form a single piece, and the electron injection layers of all the light-emitting units on each island portion 11 are connected to form a single piece.

Also, the common auxiliary layer 5 is generally fabricated by a patterning process, that is, the common auxiliary layer 5 on each island portion 11 is formed on the substrate 1 by using a second mask.

The second mask has a plurality of second openings, and each second opening corresponds to one island portion 11. As can be seen, compared with the case that all the auxiliary layers for realizing the same function on each island portion 11 are separate structures, the number of the second openings of the second mask is reduced, and the size of the second opening is increased, so that it is convenient for fabricating the second mask, and therefore the process difficulty in forming the auxiliary layer on each island portion 11 is reduced by the technical solution of the present disclosure.

In an embodiment, as shown in FIGS. 2a and 2b, an orthographic projection of any common auxiliary layer 5 on the island portion 11 (in the figure, 5a refers to an periphery of the orthographic projection of the common auxiliary layer on the island portion) covers the pixel region 01, and the periphery of the orthographic projection of the common auxiliary layer 5 on the island portion 11 is outside the periphery of the pixel region 01.

In an embodiment, the common auxiliary layer 5 is generally fabricated by a patterning process, that is, the common auxiliary layer 5 on each island portion 11 is formed on the substrate 1 using a second mask (e.g., patterned open mask). The second mask has a plurality of second openings for defining the pattern of the common auxiliary layer 5, and the plurality of second openings are in one-to-one correspondence to the plurality of island portions 11 of the substrate 1.

In the patterning process, vapor of a material (such as an organic material) of the common auxiliary layer 5 is evaporated onto the second mask, and the vapor may pass through the second openings of the second mask and then may be deposited on the substrate 1, thereby forming the common auxiliary layers 5 at desired positions.

Meanwhile, on each island portion 11, the periphery of the orthographic projection of the common auxiliary layer 5 on the island portion 11 is outside the periphery of the pixel region 01, that is, the common auxiliary layer 5 is larger than the pixel region 01 when viewed in a plan view, that is, the second opening is larger than the pixel region 01. Therefore, when the common auxiliary layer 5 is fabricated by using the patterning process, and the second opening of the second mask is slightly shifted, due to the position shift, from the region where the common auxiliary layer 5 is to be formed, it can be ensured that the common auxiliary layer 5 covers all the light-emitting layers 6 and all the first electrode layers 4 on each island portion 11.

In the related art, the isolation pillars 10 are first formed on the substrate 1 before the common auxiliary layers 5 are formed on the substrate 1, and then the common auxiliary layers 5 are formed on the entire substrate 1 by an evaporation or inkjet printing process, so that the second mask is not required when the common auxiliary layers 5 are formed. However, in practice, the effect of isolating the common auxiliary layer 5 by the isolation pillars 10 is not good, that is, the common auxiliary layer 5 on the island portion 11 and the common auxiliary layer 5 on the bridge portion 12 are easily connected to each other. Therefore, moisture in the air inevitably enters into the inside of the light-emitting unit through the portion of the common auxiliary layer 5 at the opening between the island portion 11 and the bridge portion 12.

Compared with the related art, in the technical solution of the present application, any common auxiliary layer 5 on each island portion 11 is only disposed on the island portion, and any common auxiliary layer 5 is smaller than the island portion 11 when viewed in a plan view, so that it is ensured that the common auxiliary layer 5 can be completely encapsulated by the encapsulation layer 8.

In an embodiment, the layer structures on each island portion 11 include a plurality of the common auxiliary layers 5, and orthographic projections of the common auxiliary layers 5 in different layers on the island portion 11 coincide.

The patterns of the common auxiliary layers 5 in different layers are the same, so that the structures of the second masks can be the same, that is, the common auxiliary layers 5 in different layers can be formed by using only one second mask, and therefore the formation process of the common auxiliary layers 5 is further simplified.

In an embodiment, all the second electrode layers 7 on each island portion 11 are connected to form a single piece.

The periphery of the orthographic projection of the second electrode layer 7 on each island portion 11 is outside the periphery of the orthographic projection of any common auxiliary layer 5 on the island portion 11.

The island portion 11 is further provided with an electrode lead 2 connected to the second electrode layer 7, a through hole 9 is disposed in the layer structure between the second electrode layer 7 and the electrode lead 2, and the second electrode layer 7 is in contact with the electrode lead 2 through the through hole 9.

In an embodiment, the orthographic projection 3a of the through hole 9 on the island portion is outside the periphery of the orthographic projection of any common auxiliary layer 5 on the island portion 11, and at least partly inside the periphery of the orthographic projection of the second electrode layer 7 on the island portion 11.

In an embodiment, the electrode lead 2 is closer to the substrate 1 than the second electrode layer 7, and the electrode lead 2 (VSS) is connected to the second electrode layer 7 through the through hole 9 to form a loop of the first electrode layer 4—the second electrode layer 7—the electrode lead 2, so as to excite the light-emitting layer 6 to emit light.

In an embodiment, the second electrode layer 7 and the electrode lead 2 are in contact through the through hole 9, that is, the material of the second electrode layer 7 enters into the through hole 9 and extends from the through hole 9 to the layer where the electrode lead 2 is located, so as to realize the contact between the second electrode layer 7 and the electrode lead 2.

In an embodiment, the orthographic projection 3a of the through hole 9 on the island portion does not overlap with the orthographic projection of the common auxiliary layer 5 on the island portion. At the same time, the orthographic projection 3a of the through hole 9 on the island portion is at least partially inside the periphery of the orthographic projection of the second electrode layer 7 on the island portion 11, thereby ensuring that the second electrode layer 7 can contact the electrode lead 2 through the through hole 9.

Figure 3:
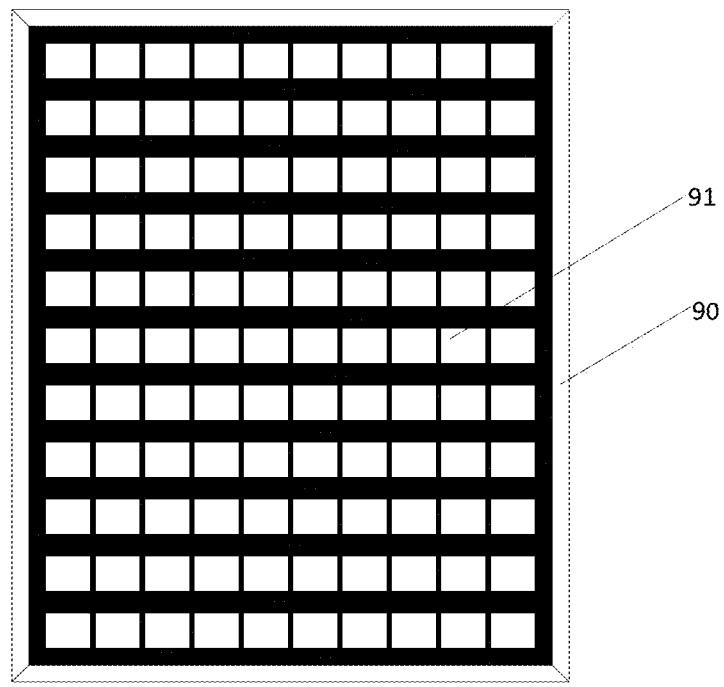
FIG. 3 is a schematic structural diagram of a first mask for a display substrate according to an embodiment of the disclosure.

In an embodiment, when viewed in a plan view, referring to FIG. 2b, the common auxiliary layer 5 is larger than the pixel region 01 (box A indicates the periphery of the common auxiliary layer 5 and corresponds to 5a in FIG. 2a), and the second electrode layer 7 (box B indicates the periphery of the second electrode layer 7 and corresponds to the first opening 91 in FIG. 3) may be larger than the common auxiliary layer 5 (of course also may be larger than the pixel region 01), so that the through hole 9 may be provided in the layer structure between the second electrode layer 7 and the electrode lead 2. The electrode lead 2 may be disposed around the periphery of the common auxiliary layer 5 and extend in a region between the periphery of the common auxiliary layer 5 and the periphery of the second electrode layer 7.

For example, when viewed in a plan view, the patterns of the pixel region 01, the common auxiliary layer 5, and the second electrode layer 7 are each square, the side of the common auxiliary layer 5 is 40 μm longer than the side of the pixel region 01, and the side of the second electrode layer 7 is 40 μm longer than the side of the common auxiliary layer 5.

In an embodiment, as shown in FIG. 1, the layer structure between the second electrode layer 7 and the electrode lead 2 may be a pixel defining layer (PDL) 3, and the through hole 9 may be provided in the pixel defining layer (box C indicates the periphery of the pixel defining layer). The pixel defining layer 3 is used for defining respective sub-pixels, a plurality of accommodation openings are formed therein, and one first electrode layer 4 and one light-emitting layer 6 are in a respective one of the accommodating openings.

In an embodiment, the pixel defining layer 3 is also a layer structure, so it may also be smaller than the island portion 11.

For example, the pattern of the common auxiliary layer 5 is rectangular, the pattern of the second electrode layer 7 is also rectangular, and the orthographic projections 3*a* of the through holes 9 on the island portion may be located at four corners of the orthographic projection 5*a* of the common auxiliary layer 5 on the island portion. For example, referring to FIG. 2*b*, the orthographic projections 3*a* of the through holes 9 on the island portion may be located at four corners of the orthographic projection of the second electrode layer 7 on the island portion, and the second electrode layer 7 and the electrode lead 2 are electrically connected to each other through the through holes 9 at the four corners.

In an embodiment, the substrate 1 is made of a flexible material in order to avoid damage caused by the display substrate being stretched or folded.

The substrate 1 is flexible and deformable, so the display substrate in the above embodiments is a stretchable display substrate.

In an embodiment, as shown in FIG. 1, the encapsulation layer 8 may include a first encapsulation sub-layer 81, a second encapsulation sub-layer 82, and a third encapsulation sub-layer 83. The first encapsulation sub-layer 81 and the third encapsulation sub-layer 83 may be made of inorganic materials, and may be disposed on the substrate 1 by chemical vapor deposition (CVD); and the second encapsulation sub-layer 82 may be made of an organic material and may be disposed on the substrate 1 by an inkjet printing (IJP) process.

In an embodiment, the encapsulation layer 8 covering the island portion 11 means that the encapsulation layer 8 composed of all the encapsulation sub-layers collectively covers each island portion 11, and does not mean that each encapsulation sub-layer can cover the island portion 11 individually. For example, the first encapsulation sub-layer 81 and the third encapsulation sub-layer 83 cover the entire island portion 11, but the size of the second encapsulation sub-layer 82 is the same as the size of the second electrode layer (cathode layer) 7 when viewed in a plan view.

The present embodiment provides a display device including the display substrate described in the above embodiments.

In the embodiment, the encapsulation layer on each island portion forms an independent encapsulation structure, and all the layer structures on the island portion are encapsulated in the encapsulation structure, so that moisture in air is prevented from entering into the light-emitting unit, and the service life of the light-emitting unit is prolonged.

As shown in FIGS. 1 to 3 and FIG. 5, the present embodiment provides a method for fabricating a display substrate, including steps S1 to S3.

Step S1 includes providing a substrate 1, the substrate 1 including a plurality of island portions 11 spaced apart from each other and a plurality of bridge portions 12 connected between the island portions 11, and the substrate 1 having a plurality of openings in regions without the island portions and the bridge portions.

Step S2 includes forming a plurality of layer structures on each island portion 11 such that the layer structures on each island portion form at least one light-emitting unit, and forming a encapsulation layer 8 on a side of the light-emitting unit away from the substrate.

Figure 2C:
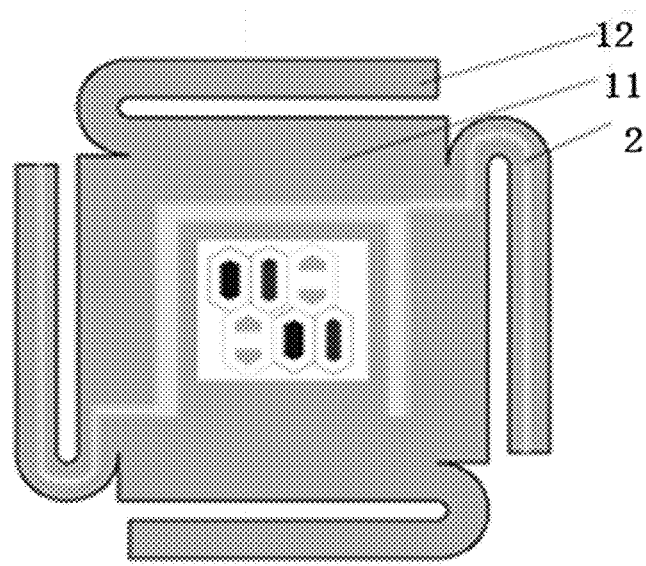
FIG. 2c is a diagram showing an intermediate step of a method of fabricating a display substrate according to an embodiment.

In an embodiment, before step S2, the method further includes: providing, in the island portion 11, an electrode lead 2 surrounding the layer structures to be formed and extending within the bridge portion 12, as shown in FIG. 2*c*.

In an embodiment, the orthographic projection of any layer structure on an island portion 11 is inside the island portion 11, and the orthographic projection of the encapsulation layer 8 on an island portion 11 covers the island portion 11.

In the embodiment, the orthographic projections of all the layer structures formed on each island portion 11 by the patterning process on the island portion 11 are inside the island portion 11, so as to encapsulate the light-emitting units on each island portion 11 in an independent encapsulation structure, thereby avoiding the damage of the light-emitting units by the moisture in the air while not increasing the process difficulty for fabricating the display substrate.

In an embodiment, forming a plurality of layer structures on each island portion includes the following steps.

A pixel defining layer 3 is formed on each island portion 11 by a patterning process, and through holes 9 are formed at positions of the pixel defining layer 3 close to four corners of the island portion.

A plurality of first electrode layers 4 are formed on each island portion 11 by a patterning process, and an orthographic projection of each first electrode layer 4 on an island portion 11 defines a sub-pixel region.

A plurality of light-emitting layers 6 in one-to-one correspondence to the first electrode layers 4 are formed on each island portion 11 by a patterning process, and the orthographic projection of each light-emitting layer 6 on the island portion 11 is in one sub-pixel region. In an embodiment, the light-emitting layer is formed by evaporating a material of the light-emitting layer using a fine metal mask.

The second electrode layer 7 is formed on each of the plurality of island portions 11 by a patterning process by corresponding each of the first openings 91 on a first mask 90 to a region of the island portion 11 of the substrate 1 where the second electrode layers 7 is to be formed, the orthographic projection of the second electrode layer 7 on the island portion 11 covering all sub-pixel regions of the island portion, and the periphery of the orthographic projection of the second electrode layer 7 on the island portion 11 surrounds the outside of the periphery of all the sub-pixel regions.

In an embodiment, the first mask 90 is placed on a side of the light-emitting layer 6 away from the substrate 1, each first opening 91 on the first mask 90 corresponds to a region on a respective one of the island portions 11 where the second electrode layer 7 is to be formed. In other words, a region on the substrate 1 other than the region where the second electrode layer 7 is to be formed, is shielded by the first mask 90, and thus, the second electrode layer 7 can only be formed in the non-shielded region of the substrate 1 by a patterning process (such as evaporation and inkjet printing).

Meanwhile, the orthographic projection of the second electrode layer 7 on an island portion 11 covers all the sub-pixel regions of the island portion 11, and the periphery of the orthographic projection of the second electrode layer 7 on the island portion 11 surrounds the outside of the periphery of all the pixel regions. That is, on each island portion 11, the second electrode layer 7 is larger than the region occupied by all the sub-pixel regions, and all the light-emitting units on the island portion 11 share the second electrode layer 7.

In an embodiment, after forming the first electrode layer 4 and before forming the second electrode layer 7, the method further includes: forming the common auxiliary layer 5 (step S3). In an embodiment, at least one common auxiliary layer 5 is formed on each of the plurality of island portions 11 by a patterning process by corresponding each of the second openings of a second mask to a region of the island portion of the substrate 1 where the common auxiliary layer 5 is to be formed, the orthographic projection of any common auxiliary layer 5 on the island portion 11 covers all sub-pixel regions of the island portion, and the periphery of the orthographic projection of the common auxiliary layer 5 on the island portion 11 surrounds the outside of the periphery of all sub-pixel regions of the island portion.

In an embodiment, the side of the second opening of the second mask is about 40 µm longer than the side of the pixel region. Therefore, even if position offset occurs at the time of evaporation, the material of the common auxiliary layer can be ensured to be evaporated onto the pixel region. The side of the first opening of the first mask is about 40 µm longer than that of the second opening of the second mask, so that the cathode layer is ensured to be electrically connected to the electrode lead through the through hole.

In an embodiment, the second mask is arranged on a side of the first electrode layer 4 away from the substrate 1. Each second opening of the second mask corresponds to a region of a respective one of the island portions 11 on which the common auxiliary layer 5 is to be formed. In other words, a region on the substrate 1 other than the region in which the common auxiliary layer 5 is to be formed, is shielded by the second mask, and thus, the common auxiliary layer 5 can only be formed in the non-shielded region of the substrate 1 by a patterning process (such as evaporation and inkjet printing).

Meanwhile, the orthographic projection of any common auxiliary layer 5 on an island portion 11 covers all the sub-pixel regions of the island portion 11, and the periphery of the orthographic projection of the common auxiliary layer 5 on an island portion 11 is located outside the periphery of all the pixel regions of the island portion 11, that is, the common auxiliary layer 5 occupies a larger region than all the sub-pixel regions on each island portion 11, and all the light-emitting units on the island portion 11 share the common auxiliary layer 5.

In an embodiment, the method further includes: forming an encapsulation layer over the entire substrate. Specifically, the first and third encapsulation sub-layers 81 and 83 are formed on the entire surface of the substrate by a chemical vapor deposition (CVD) process, and the second encapsulation sub-layer 82 is formed on the substrate by an inkjet printing (IJP) process. The periphery of the second encapsulation sub-layer 82 may be aligned with or outside the periphery of the second electrode layer (cathode layer).

It should be noted that, herein, relationship terms such as first, second, and the like are used solely to distinguish one entity or operation from another entity or operation without necessarily requiring or implying any actual relationship or order between such entities or operations. Furthermore, the terms "include", "comprise" or any other variation thereof, are intended to cover a non-exclusive inclusion, such that a process, method, article, or apparatus that includes a list of elements not only includes those elements but may also include other elements not expressly listed or inherent to such process, method, article, or apparatus. Without further limitation, an element defined by the phrase "including a . . . " does not exclude the presence of other identical elements in the process, method, article, or apparatus that includes the element.

The embodiments according to the present disclosure are described above, and these embodiments are not intended to be exhaustive or to limit the disclosure to the specific embodiments disclosed. Obviously, many modifications and variations are possible in light of the above teaching. The embodiments were chosen and described in order to best explain the principles and the practical application of the disclosure, to thereby enable those skilled in the art to best utilize the present disclosure and make various modifications based on the present disclosure. The present disclosure is to be limited only by the claims and their full scope and equivalents thereof.

What is claimed is:

1. A display substrate, comprising:
    a substrate, comprising a plurality of island portions spaced apart from each other and a plurality of bridge portions connected between the island portions, the substrate having a plurality of openings in regions without the plurality of island portions and the plurality of bridge portions;
    a layer structure on each of the plurality of island portions and comprising a light-emitting layer, a common auxiliary layer and a first electrode layer stacked with each other, the layer structure on each of the plurality of island portions forms at least one light-emitting unit, and
    an encapsulation layer on a side of the light-emitting unit away from the substrate;
    wherein on each of the plurality of island portions, an orthographic projection of the common auxiliary layer on the island portion covers an orthographic projection of the light-emitting layer on the island portion, an orthographic projection of the first electrode layer on the island portion covers the orthographic projection of the common auxiliary layer on the island portion, the orthographic projection of the first electrode layer on the island portion is inside the island portion, and an orthographic projection of the encapsulation layer on the island portion covers the island portion.

2. The display substrate of claim 1, wherein on each of the plurality of island portions,
    the layer structure forms a plurality of light-emitting units, the layer structure of each of the plurality of light-emitting units further comprises a second electrode layer, the light-emitting layer is between the first electrode layer and the second electrode layer, and the second electrode layer is on a side of the first electrode layer close to the substrate; and
    the island portion has a pixel region comprising a plurality of sub-pixel regions, an orthographic projection of each second electrode layer on the island portion defines one sub-pixel region, the pixel region is inside the island portion, and orthographic projections of the second electrode layer and the light-emitting layer of each of the plurality of light-emitting units on the island portion are inside one sub-pixel region.

3. The display substrate of claim 2, wherein the first electrode layer on each of the plurality of island portions is formed as a single piece.

4. The display substrate of claim 3, wherein on each of the plurality of island portions, the pixel region is inside the orthographic projection of the first electrode layer on the island portion.

5. The display substrate of claim 2, wherein the common auxiliary layer is between the first electrode layer and the second electrode layer.

6. The display substrate of claim 5, wherein on each of the plurality of island portions, the pixel region is inside the orthographic projection of the common auxiliary layer on the island portion.

7. The display substrate of claim 5, wherein the layer structure on each of the plurality of island portions comprises a plurality of common auxiliary layers, and orthographic projections of the plurality of common auxiliary layers in different layers on the island portion coincide with each other.

8. The display substrate of claim 5, wherein on each of the plurality of island portions,
the first electrode layer is formed as a single piece;
the orthographic projection of the common auxiliary layer on the island portion falls inside the orthographic projection of the first electrode layer on the island portion;
the island portion is further provided with an electrode lead connected to the first electrode layer, a through hole is in a layer structure between the first electrode layer and the electrode lead, and the first electrode layer is in contact with the electrode lead through the through hole; and
an orthographic projection of the through hole on the island portion is outside the orthographic projection of the common auxiliary layer on the island portion and inside the orthographic projection of the first electrode layer on the island portion.

9. The display substrate of claim 1, wherein the first electrode layer is a cathode layer and the second electrode layer is an anode layer.

10. The display substrate of claim 1, wherein the substrate is made of a flexible material, the plurality of island portions are arranged in an array, and the plurality of bridge portions are configured to deform in response to the display substrate being stretched so that the display substrate is stretchable.

11. The display substrate of claim 8, wherein when viewed in a plan view, the electrode lead is around a periphery of the common auxiliary layer and extends in a region between the periphery of the common auxiliary layer and a periphery of the first electrode layer and to the bridge portion.

12. The display substrate of claim 8, wherein the first electrode layer on each island portion is electrically connected to the electrode lead.

13. The display substrate of claim 8, wherein the layer structure further comprises a pixel defining layer configured to define the light-emitting units, the through hole being in the pixel defining layer.

14. The display substrate of claim 8, wherein four through holes are in the layer structure between the first electrode layer and the electrode lead, and orthographic projections of the four through holes on the island portion are at four corners of the orthographic projection of the first electrode layer on the island portion.

15. The display substrate of claim 2, wherein the encapsulation layer comprises a first encapsulation sub-layer, a second encapsulation sub-layer, a third encapsulation sub-layer, and the first encapsulation sub-layer and the third encapsulation sub-layer comprise an inorganic material and the second encapsulation sub-layer comprises an organic material.

16. The display substrate of claim 15, wherein
the first encapsulation sub-layer and the third encapsulation sub-layer are whole-layer structures, respectively, orthographic projections of the first encapsulation sub-layer and the third encapsulation sub-layer on the plurality of island portions cover the plurality of island portions, and
on each of the plurality of island portions, an orthographic projection of the second encapsulation sub-layer on the island portion is completely overlapped with the orthographic projection of the first electrode layer on the island portion.

17. A display device, wherein the display device comprises the display substrate according to claim 1.

18. A method for fabricating a display substrate, wherein the display substrate is the display substrate of claim 1, the method comprising:
providing the substrate, the substrate comprising the plurality of island portions spaced apart from each other and the plurality of bridge portions connected between the island portions;
forming, on each of the plurality of island portions, the layer structure comprising the light-emitting layer, the common auxiliary layer, and the first electrode layer stacked with each other, such that the layer structure on each of the plurality of island portions form at least one light-emitting unit; and
forming the encapsulation layer on the side of the light-emitting unit away from the substrate.

19. The method of claim 18, wherein forming the layer structure on each of the plurality of island portions comprises:
forming the plurality of second electrode layers on each of the plurality of island portions by a patterning process, wherein an orthographic projection of each of the plurality of second electrode layers on the island portion defines a sub-pixel region;
forming the plurality of light-emitting layers in one-to-one correspondence to the plurality of second electrode layers on each of the plurality of island portions by a patterning process, wherein an orthographic projection of each of the plurality of light-emitting layer on the island portion is inside one sub-pixel region; and
forming the first electrode layer on each of the plurality of island portions by a patterning process by corresponding each of first openings of a first mask to a region of the island portion where a respective one of the first electrode layers is to be formed, the orthographic projection of the first electrode layer on the island portion covering all sub-pixel regions of the island portion, and the sub-pixel regions being inside the orthographic projection of the first electrode layer on the island portion.

20. The method of claim 19, wherein after forming the second electrode layer and before forming the first electrode layer, the method further comprises:
forming at least one common auxiliary layer on each of the plurality of island portions by a patterning process by corresponding each of second openings of a second mask to a region of the island portion where a respective one common auxiliary layer is to be formed, the orthographic projection of the common auxiliary layer on the island portion covering all sub-pixel regions on the island portion, and the sub-pixel regions being inside the orthographic projection of the common auxiliary layer on the island portion.

* * * * *